(12) United States Patent
Jungerman et al.

(10) Patent No.: US 7,312,737 B2
(45) Date of Patent: Dec. 25, 2007

(54) BANDWIDTH ENHANCEMENT BY TIME INTERLEAVING MULTIPLE DIGITAL TO ANALOG CONVERTERS

(75) Inventors: Roger Lee Jungerman, Petaluma, CA (US); Paul Lewis Corredoura, Redwood City, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 59 days.

(21) Appl. No.: 11/315,406

(22) Filed: Dec. 22, 2005

(65) Prior Publication Data

US 2007/0146186 A1    Jun. 28, 2007

(51) Int. Cl.
*H03M 1/00* (2006.01)
(52) U.S. Cl. ...................... 341/141; 341/144
(58) Field of Classification Search .............. 341/141, 341/144
See application file for complete search history.

(56) References Cited

U.S. PATENT DOCUMENTS

| | | | | |
|---|---|---|---|---|
| 4,591,832 A | * | 5/1986 | Fling et al. ........... | 341/141 |
| 5,155,488 A | * | 10/1992 | Takahashi ........... | 341/144 |
| 5,689,259 A | * | 11/1997 | Ozguc ............... | 341/144 |
| 6,061,010 A | * | 5/2000 | Adams et al. ........ | 341/144 |
| 6,778,116 B1 | * | 8/2004 | Skones et al. ....... | 341/144 |
| 6,977,602 B1 | * | 12/2005 | Ostrem et al. ....... | 341/145 |
| 7,042,379 B2 | * | 5/2006 | Choe ................. | 341/144 |

* cited by examiner

*Primary Examiner*—Khai M. Nguyen

(57) ABSTRACT

A digital-to-analog converting system for producing an interleaved analog signal with enhanced bandwidth includes a first digital-to-analog converter for receiving a first digital data stream and converting the first digital data stream to a first analog signal and a second digital-to-analog converter for receiving a second digital data stream and converting the second digital data stream to a second analog signal. The digital-to-analog converting system is clocked by a clock signal having a clock period, and further includes first timing circuitry for receiving the first analog signal and outputting the first analog signal for a first half of the clock period and second timing circuitry for receiving the second analog signal and outputting the second analog signal for a second half of the clock period to produce the interleaved analog signal.

20 Claims, 2 Drawing Sheets

BANDWIDTH ENHANCEMENT BY TIME INTERLEAVING MULTIPLE DIGITAL TO ANALOG CONVERTERS

BACKGROUND OF THE INVENTION

In high performance digital to analog converter (DAC) designs, manufacturers are continually striving to improve the dynamic range and noise performance while simultaneously increasing the bandwidth. However, due to nonlinear imperfections, DACs frequently produce out-of-band harmonic terms (e.g., second and third harmonics). Often, the worst harmonics are produced at higher signal frequencies. If the nonlinear distortion occurs in the DAC current sources prior to resampling in the DAC, the high frequency harmonics are aliased back in-band. These spurs are commonly referred to as folded harmonics, and are typically the most destructive spurious signals. As such, folded harmonics set a limit on the spurious free dynamic range of a DAC.

Thus, even though it is desirable in high performance DAC design to obtain both high modulation bandwidth and wide dynamic range, in a given DAC design, there is a limit on how high the sample clock frequency can be driven before the noise rises significantly along with the harmonic distortion. For example, the sample clock frequency in some conventional high performance DACs is approximately 1.25 GHz. In addition, it is difficult to deliver high amounts of digital data to a single DAC. Therefore, what is needed is a high performance DAC design that increases the output bandwidth without significantly degrading the analog performance.

SUMMARY OF THE INVENTION

Embodiments of the present invention provide a digital-to-analog converting system capable of producing an interleaved analog signal with enhanced bandwidth. The digital-to-analog converting system includes a first digital-to-analog converter connected to receive a first digital data stream and operable to convert the first digital data stream to a first analog signal and a second digital-to-analog converter connected to receive a second digital data stream and operable to convert the second digital data stream to a second analog signal. The digital-to-analog converting system is clocked by a clock signal having a clock period, and further includes first timing circuitry connected to receive the first analog signal and operable to output the first analog signal for a first half of the clock period and second timing circuitry connected to receive the second analog signal and operable to output the second analog signal for a second half of the clock period. A combiner combines the first analog signal and the second analog signal to produce the interleaved analog signal.

In one embodiment, the first digital-to-analog converter is operable to convert the first digital data stream to the first analog signal on a first edge of the clock period and the second digital-to-analog converter is operable to convert the second digital data stream to the second analog signal at a second edge of the clock period. In a further embodiment, the first timing circuitry includes a first sample and hold circuit operable to receive the first analog signal on the first edge and to output the first analog signal on the second edge and the second timing circuitry includes a second sample and hold circuit operable to receive the second analog signal on the second edge and to output the second analog signal on the first edge.

In another embodiment, the first digital-to-analog converter further includes a first return-to-zero sub-digital-to-analog converter connected to receive the first digital data stream and a second return-to-zero sub-digital-to-analog converter. The first return-to-zero sub-digital-to-analog converter and the second return-to-zero sub-digital-to-analog converter are independently controllable such that the second return-to-zero sub-digital-to-analog converter is disabled while the first return-to-zero sub-digital-to-analog converter is receiving and converting the first digital data stream. In addition, the second digital-to-analog converter further includes a third return-to-zero sub-digital-to-analog converter connected to receive the second digital data stream and a fourth return-to-zero sub-digital-to-analog converter. The third return-to-zero sub-digital-to-analog converter and the fourth return-to-zero sub-digital-to-analog converter are independently controllable such that the fourth return-to-zero sub-digital-to-analog converter is disabled while the third return-to-zero sub-digital-to-analog converter is receiving and converting the second digital data stream.

Embodiments of the present invention further provide a method for producing an interleaved analog signal. The method includes receiving a first digital data stream, a second digital data stream and a clock signal having a clock period. The method further includes converting the first digital data stream to a first analog signal, converting the second digital data stream to a second analog signal, outputting the first analog signal for a first half of the clock period and outputting the second analog signal for a second half of the clock period to produce the interleaved analog signal.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS

Figure 1:
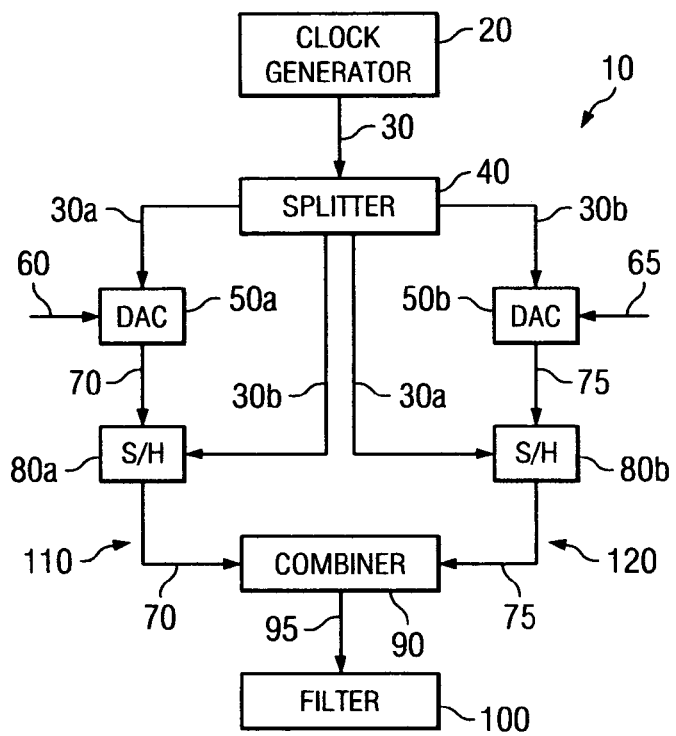
FIG. 1 is a block diagram illustrating an exemplary digital-to-analog converter system capable of producing a time-interleaved analog signal with enhanced bandwidth, in accordance with embodiments of the present invention.

FIG. 1 is a block diagram illustrating an exemplary digital-to-analog converter system 10 capable of producing a time-interleaved analog signal 95 with enhanced bandwidth, in accordance with embodiments of the present invention. The system 10 includes a first digital-to-analog converter (DAC) 50a, a second DAC 50b, first timing circuitry 80a, second timing circuitry 80b and a combiner 90. The first DAC 50a is connected to receive a first digital data stream 60, while the second DAC 50b is connected to receive a second digital data stream 65. Each DAC 50a and 50b includes current sources operable to produce current at a level corresponding to the current value of digital data in the respective digital data stream 60 and 65. The DACs 50a and 50b are preferably return-to-zero (RZ) DACs. However, in other embodiments, non-return-to-zero (NRZ) DACs may be used.

In an exemplary embodiment, the first digital data stream 60 and second digital data stream 65 together form a master digital data stream that describes a sinusoidal tone. For example, in one embodiment, the master digital data stream is an interleaved data stream constructed at twice the data rate. Even samples of the interleaved data stream are sent to the first DAC 50a as the first digital data stream 60 and odd samples of the interleaved data stream are sent to the second DAC 50b as the second digital data stream 65. Thus, each DAC 50a and 50b produces twice the analog bandwidth and half the total output current.

The DACs 50a and 50b and timing circuitry 80a and 80b are clocked by a clock signal 30 produced by a clock generator 20. The clock signal 30 has a clock period whose frequency is determined based on the design of each DAC 50a and 50b and the desired dynamic range and noise performance of the DACs 50a and 50b. The clock signal 30 is input to a splitter 40, which delivers clock signals 30a and 30b to the DACs 50a and 50b and the timing circuitry 80a and 80b. In one embodiment, the clock signals 30a and 30b delivered to the DACs 50a and 50b and timing circuitry 80a and 80b represent the same edge of the clock period of the clock signal 30, such that the DACs 50a and 50b and timing circuitry 80a and 80b are all clocked on the same edge of the clock period. In another embodiment, the clock signals 30a and 30b delivered to the DACs 50a and 50b and timing circuitry 80a and 80b represent different edges of the clock period of the clock signal 30, such that the DACs 50a and 50b are clocked on different edges of the clock period (e.g., DAC 50a is clocked on the rising edge and DAC 50b is clocked on the falling edge) and the timing circuitry 80a and 80b are likewise clocked on different edges of the clock period (e.g., timing circuitry 80a is clocked on the falling edge and timing circuitry 80b is clocked on the rising edge).

DAC's 50a and 50b each operate to convert their respective digital data streams 60 and 65 into respective analog signals 70 and 75 and to output their respective analog signals 70 and 75 to respective timing circuitry 80a and 80b. Timing circuitry 80a outputs analog signal 70 for one half of the clock period of the clock signal 30, while timing circuitry 80b outputs analog signal 75 for the other half of the clock period. Therefore, each analog signal 70 and 75 is produced for only one-half of the clock period to avoid overlap and interference between analog signals 70 and 75. For example, timing circuitry 80a can output analog signal 70 from the rising edge of the clock signal to the falling edge of a current clock period of the clock signal and output a null value ("zero") from the falling edge of the clock signal to the rising edge of the next clock period of the clock signal. In addition, timing circuitry 80b can output analog signal 75 from the falling edge of the current clock period to the rising edge of the next clock period and output a null value ("zero") from the rising edge of the next clock period to the falling edge of the next clock period. The sample and hold 80a and 80b are typically integrated into the DAC circuits 50a and 50b in a RZ DAC.

In an exemplary embodiment in which RZ DACs are used, timing circuitry 80a and 80b each include sample and hold circuits operable to receive respective analog signals 70 and 75 on one edge of the clock period and to output their respective analog signals 70 and 75 on the other edge of the clock period. In another embodiment in which NRZ DACs are used, the timing circuitry 80a and 80b is used to convert the NRZ DAC to RZ operation. For example, timing circuitry 80a can output analog signal 70 from the rising edge of the clock signal to the falling edge of a current clock period of the clock signal and output a null value ("zero") from the falling edge of the clock signal to the rising edge of the next clock period of the clock signal. In addition, timing circuitry 80b can output analog signal 75 from the falling edge of the current clock period to the rising edge of the next clock period and output a null value ("zero") from the rising edge of the next clock period to the falling edge of the next clock period. In most cases, the sample and hold 80a and 80b is separate from the NRZ DAC 50a and 50b.

The combiner 90 receives the analog signals 70 and 75 from the timing circuitry 80a and 80b and time interleaves the analog signals 70 and 75 to produce the interleaved analog signal 95. More specifically, the combiner 90 receives one of the analog signals 70 on one edge of the clock period and receives the other analog signal 75 on the other edge of the clock period to enable interleaving of the analog signals 70 and 75. Thus, the time delay between the analog signals 70 and 75 input to the combiner 90 is half of the sample clock period. The resulting interleaved analog signal 95 output from the digital-to-analog converting system 10 has a bandwidth double that produced by a single DAC.

In one embodiment, the time delay between the analog signals 70 and 75 is achieved by clocking the DACs 50a and 50b on different edges of the clock period. For example, DAC 50a can output analog signal 70 on the rising edge of the clock period, while DAC 50b can output analog signal 75 on the falling edge of the clock period. In this example, timing circuitry 80a receives analog signal 70 on the rising edge of the clock period, holds analog signal 70 and outputs analog signal 70 on the falling edge of the clock period, while timing circuitry 80b receives analog signal 75 on the falling edge of the clock period, holds analog signal 75 and outputs analog signal 75 on the rising edge of the clock period. To avoid any mismatch between the timing of analog signals 70 and 75, the length of cables 110 and 120 extending from the timing circuitry 80a and 80b to the combiner 90 should be matched.

In another embodiment, the time delay between the analog signals 70 and 75 is achieved by precisely controlling the length of cables 110 and 120 extending from the timing circuitry 80a and 80b to the combiner 90. For example, both DAC 50a and DAC 50b can output their respective analog signals 70 and 75 on the rising edge of the clock period, and both timing circuitry 80a and timing circuitry 80b can receive their respective analog signals 70 and 75 on the rising edge of the clock signal, hold their respective analog signals 70 and 75 and output their respective analog signals 70 and 75 on the falling edge of the clock period. The difference in length between cables 110 and 120 produces the desired time delay (i.e., one-half of a clock period) between analog signals 70 and 75 at combiner 90. For example, the lengths of cables 110 and 120 can be selected to produce a time delay of one-half of the clock period between the first analog signal 70 and the second analog signal 75.

The combiner 90 includes any circuitry or other mechanism for combining analog signals 70 and 75. In one embodiment, the combiner 90 is realized by directly combining the current outputs of the timing circuitry 80a and 80b using a short path length (i.e., short cables 110 and 120). By directly combining the analog signals 70 and 75, the output voltage remains identical to that obtained by a single DAC. However, there is a risk that the output return loss of the parallel DAC combination will be compromised if the DACs 50a and 50b are not physically located close enough to each other. Thus, if the cable 110 and 120 lengths are long, direct combination could result in standing waves and frequency response ripple if the loads to each DAC 50a and 50b are not properly matched.

In another embodiment, the combiner 90 is realized by a matched power splitter, such as a matched broadband power combiner or banded coupler. However, if a matched broadband power combiner is used, the output voltage of the digital-to-analog converting system 10 is reduced by one-half. Similarly, if a banded coupler is used, the output voltage of the digital-to-analog converting system is reduced by approximately seventy percent. However, since the DAC noise floor is typically dominated by current source mismatch and other noise mechanisms within the DAC, the voltage loss of the power splitter does not significantly degrade the signal to noise ratio of the digital-to-analog converting system 10 (both the signal and the noise are equally attenuated). For differential outputs (e.g., to drive a differential I/Q modulator), a separate combiner can be used on each of the two differential outputs with rigorous control of the cable skew.

The interleaved analog signal 95 is input to a reconstruction filter 100 to remove the effects of aliasing in the interleaved analog signal 95. In normal operation using a single DAC (instead of multiple interleaved DACs, as in the present invention), the reconstruction filter 100 is typically designed for 0.4 fs, where fs is the sample rate, to remove the energy in the analog signal above fs/2. However, since the effective sample rate of the digital-to-analog converting system 10 is double that of a single DAC, the first null of the sinc is at 2 fs, and as such, the reconstruction filter 100 is designed for 0.8 fs.

In an exemplary operation in which the DACs 50a and 50b are clocked on different edges 30a and 30b of the clock signal 30, DAC 50a receives the first digital data stream 60 on a rising edge 30a of the clock signal 30, converts the first digital data stream 60 from a digital signal to a first analog signal 70 and provides the first analog signal 70 to the first timing circuitry 80a. The first timing circuitry 80a samples and holds the first analog signal 70 for one-half of a clock period and outputs the first analog signal 70 to the combiner 90 on the next falling edge 30b of the clock signal. Similarly, DAC 50a receives the second digital data stream 65 on the falling edge 30b of the clock signal 30, converts the second digital data stream 65 from a digital signal to a second analog signal 75 and provides the second analog signal 75 to the second timing circuitry 80b. The second timing circuitry 80b samples and holds the second analog signal 75 for one-half of a clock period and outputs the second analog signal 75 to the combiner 90 on the next rising edge 30a of the clock signal. The combiner 90 time interleaves the first analog signal 70 and the second analog signal 75 to produce the interleaved analog signal 95.

Figure 2:
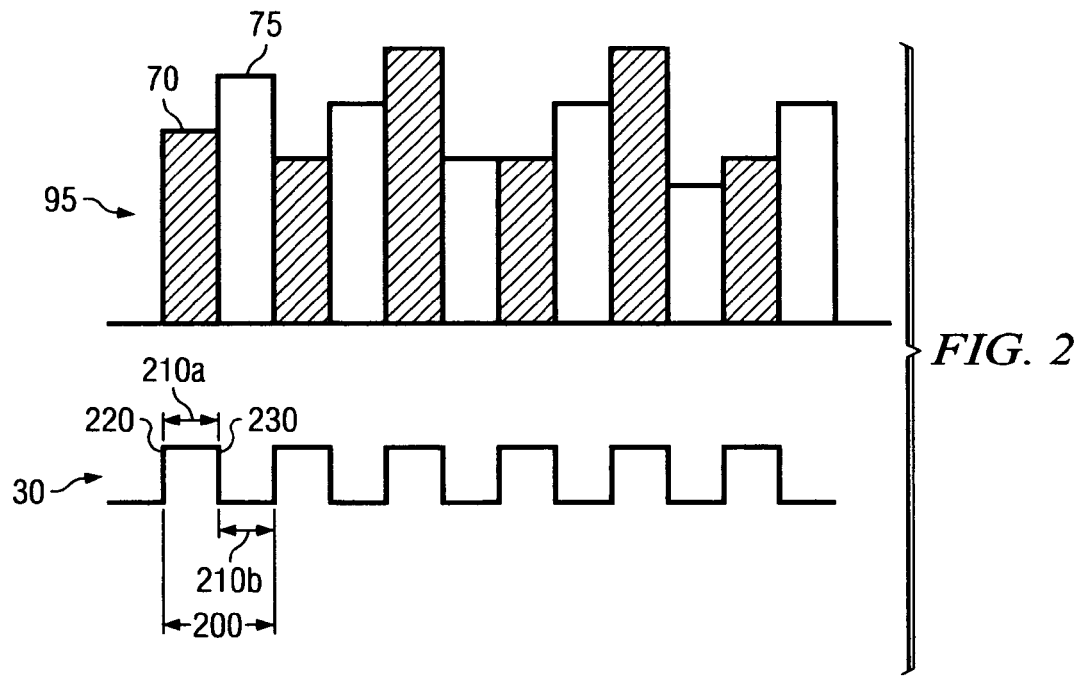
FIG. 2 is a timing diagram illustrating time interleaving of multiple analog signals, in accordance with embodiments of the present invention.

FIG. 2 is a timing diagram illustrating time interleaving of multiple analog signals 70 and 75 to produce an interleaved analog signal 95, in accordance with embodiments of the present invention. The clock signal 30 is shown in FIG. 2 to illustrate the timing of each analog signal 70 and 75 within the interleaved analog signal 95. As can be seen in FIG. 2, the clock signal 30 has a clock period 200 corresponding to a full clock cycle. Thus, each clock period 200 includes a rising edge 220 and a falling edge 230. A first half 210a of the clock period 200 runs from rising edge 220 to falling edge 230, and a second half 210b of the clock period 200 runs from falling edge 230 to the end of the clock period 200. Beginning at the rising edge 220 of each clock period 200 and for the duration of the first half 210a of the clock period 200, analog signal 70 is present in the interleaved analog signal 95. Similarly, beginning at the falling edge 230 of each clock period 200 and for the duration of the second half 210b of the clock period 200, analog signal 75 is present in the interleaved analog signal 95. As a result, interleaved analog signal 95 has a bandwidth double that of a typical analog signal produced by a single DAC.

Figure 3:
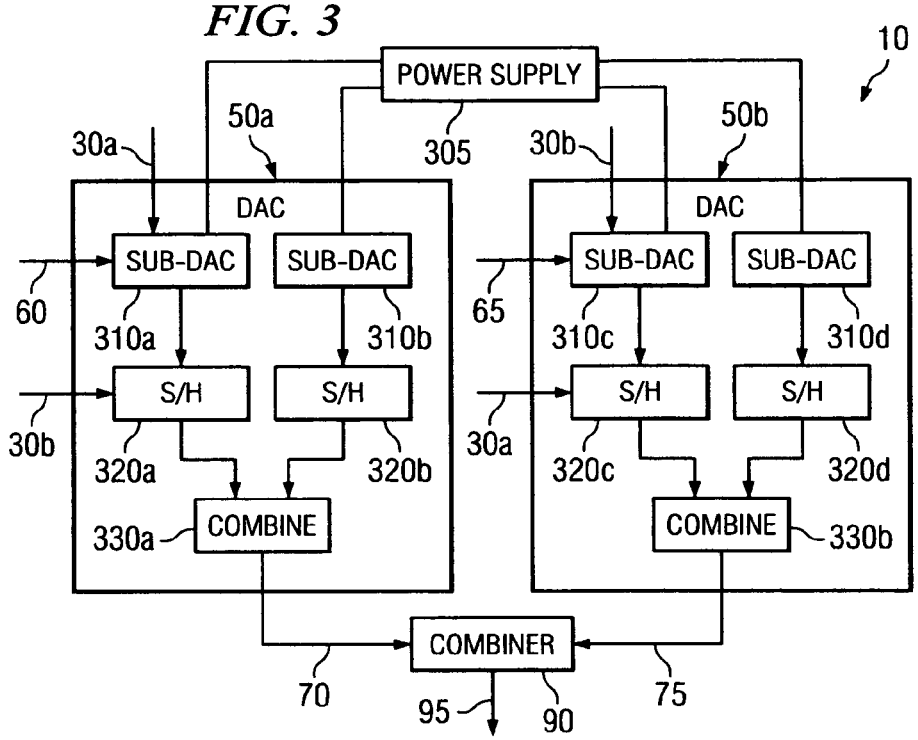
FIG. 3 is a block diagram illustrating another exemplary digital-to-analog converter system, in accordance with embodiments of the present invention.

FIG. 3 is a block diagram illustrating another exemplary digital-to-analog converter system 10, in accordance with embodiments of the present invention. In FIG. 3, DAC 50a includes DAC subsections 310a and 310b, while DAC 50b includes DAC subsections 310c and 310d. Each DAC subsection 310a-310d includes respective current sources, each capable of producing a respective output current to a respective sample and hold circuit 320a-320d. The outputs of the sample and hold circuits 320a and 320b in DAC 50a are input to combiner 330a, while the outputs of the sample and hold circuits 320c and 320d in DAC 50b are input to combiner 330b. In a conventional operation of DAC 50a, each of the sub-DACs 310a and 310b are RZ DAC's that are clocked on different edges of the clock signal. In addition, each of the current sources in sub-DACs 310a and 310b are programmed to the same value to produce a stable NRZ analog signal at the output of combiner 330a. Thus, each sample in the output analog signal maintains the same voltage value throughout the clock period. As a result, the zero order hold of each sample is a full cycle of the sample clock and the first null in the sinc frequency response is at fs, the sample rate.

To increase the bandwidth of the output of the digital-to-analog converting system 10, one sub-DAC, e.g., sub-DACs 310a and 310c, in each of the DACs 50a and 50b is used to produce respective analog signals 70 and 75, which are combined by combiner 90 to produce interleaved analog signal 95, as described above. In addition, each DAC subsection 310a-310d is independently controlled by a power supply 305. The power supply 305 can include a single power supply for all sub-DAC's 310a-310d or separate power supplies for one or more sub-DACs 310a-310d. Thus, while operating at higher bandwidths, the power supply 305 disables sub-DACs 310b and 310d to avoid overlap and interference between analog signals 70 and 75. In an exemplary embodiment, sub-DACs 310b and 310d are disabled by no loading resistors to the power supplies 305 for sub-DACs 310b and 310d.

In an exemplary operation, sub-DAC 310a receives the first digital data stream 60 on a rising edge 30a of the clock signal, converts the first digital data stream 60 from a digital signal to a first analog signal and provides the first analog signal to sample and hold circuit 320a. The sample and hold circuit 320a samples and holds the first analog signal for one-half of a clock period and outputs the first analog signal to combiner 330a on the next falling edge 30b of the clock signal. Combiner 330a outputs the first analog signal 70 to combiner 95.

Similarly, sub-DAC 310c receives the second digital data stream 65 on the falling edge 30b of the clock signal, converts the second digital data stream 65 from a digital signal to a second analog signal and provides the second analog signal to the sample and hold circuit 320c. The sample and hold circuit 320c samples and holds the second analog signal for one-half of a clock period and outputs the second analog signal to combiner 330b on the next rising edge 30a of the clock signal. Combiner 330b outputs the second analog signal 70 to combiner 95. The combiner 90 time interleaves the first analog signal 70 and the second analog signal 75 to produce the interleaved analog signal 95.

Figure 4:
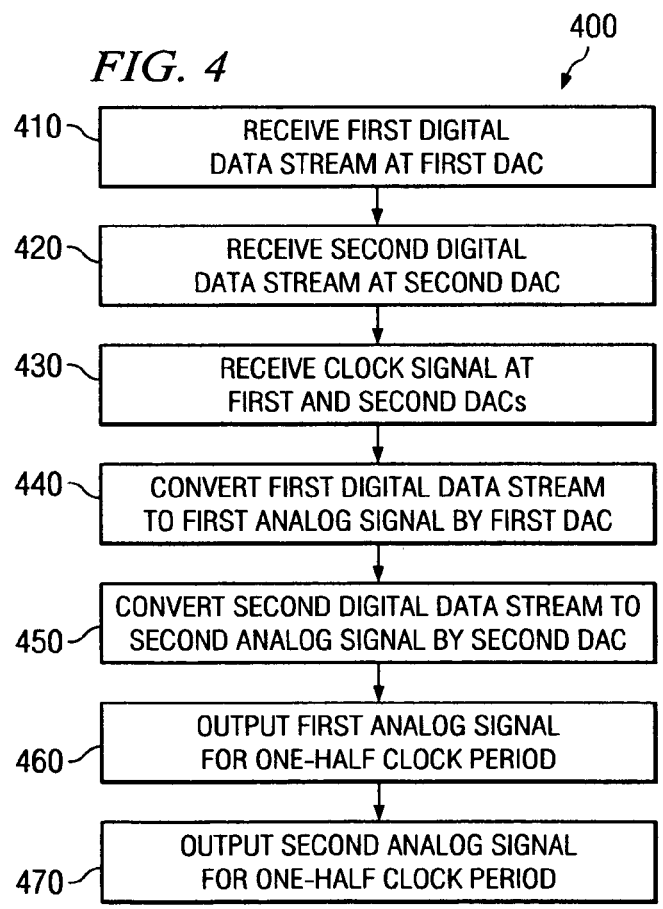
FIG. 4 is a flow chart illustrating an exemplary process for producing an interleaved analog signal with enhanced bandwidth, in accordance with embodiments of the present invention.

FIG. 4 is a flow chart illustrating an exemplary process 400 for producing an interleaved analog signal with enhanced bandwidth, in accordance with embodiments of the present invention. Processing begins at block 410 where a first digital data stream is received at a first DAC. At block 420, a second digital data stream is received at a second DAC. In addition, at block 430, a clock signal having a clock period is received at both the first DAC and the second DAC. At block 440, the first DAC converts the first digital data stream from a digital signal to a first analog signal and at block 450, the second DAC converts the second digital data stream from a digital signal to a second analog signal. Finally, at block 460, the first analog signal is output for one half of the clock period, and at block 470, the second analog signal is output for the other half of the clock period to produce the interleaved analog signal.

As will be recognized by those skilled in the art, the innovative concepts described in the present application can be modified and varied over a wide rage of applications. Accordingly, the scope of patents subject matter should not be limited to any of the specific exemplary teachings discussed, but is instead defined by the following claims.

We claim:

1. A digital-to-analog converting system clocked by a clock signal having a clock period, said system comprising:
a first digital-to-analog converter connected to receive a first digital data stream and operable to convert said first digital data stream to a first analog signal;
first timing circuitry connected to receive said first analog signal and operable to output said first analog signal for a first half of said clock period;
a second digital-to-analog converter connected to receive a second digital data stream and operable to convert said second digital data stream to a second analog signal;
second timing circuitry connected to receive said second analog signal and operable to output said second analog signal for a second half of said clock period; and
a combiner operable to combine said first analog signal and second analog signal to produce an interleaved analog signal;
wherein said first and second digital data streams are vary as a function of time and said second digital data stream is independent of said first digital data stream.

2. The system of claim 1, wherein said first digital-to-analog converter is operable to convert said first digital data stream to said first analog signal on a first edge of said clock period and said second digital-to-analog converter is operable to convert said second digital data stream to said second analog signal at a second edge of said clock period.

3. A digital-to-analog converting system clocked by a clock signal having a clock period, said system comprising:
a first digital-to-analog converter connected to receive a first digital data stream and operable to convert said first digital data stream to a first analog signal;
first timing circuitry connected to receive said first analog signal and operable to output said first analog signal for a first half of said clock period;
a second digital-to-analog converter connected to receive a second digital data stream and operable to convert said second digital data stream to a second analog signal;
second timing circuitry connected to receive said second analog signal and operable to output said second analog signal for a second half of said clock period; and
a combiner operable to combine said first analog signal and second analog signal to produce an interleaved analog signal,
wherein said first digital-to-analog converter is operable to convert said first digital data stream to said first analog signal on a first edge of said clock period and said second digital-to-analog converter is operable to convert said second digital data stream to said second analog signal at a second edge of said clock period and
wherein said first timing circuitry includes a first sample and hold circuit operable to receive said first analog signal on said first edge and to output said first analog signal on said second edge and said second timing circuitry includes a second sample and hold circuit operable to receive said second analog signal on said second edge and to output said second analog signal on said first edge.

4. A digital-to-analog converting system clocked by a clock signal having a clock period, said system comprising:
a first digital-to-analog converter connected to receive a first digital data stream and operable to convert said first digital data stream to a first analog signal;
first timing circuitry connected to receive said first analog signal and operable to output said first analog signal for a first half of said clock period;
a second digital-to-analog converter connected to receive a second digital data stream and operable to convert said second digital data stream to a second analog signal;
second timing circuitry connected to receive said second analog signal and operable to output said second analog signal for a second half of said clock period; and
a combiner operable to combine said first analog signal and second analog signal to produce an interleaved analog signal;
wherein said first digital-to-analog converter converts even samples of a master digital data stream but not odd samples of said master digital data stream and said second digital-to-analog converter converts odd samples of said master digital data stream but not said even samples of said master digital data stream.

5. A digital-to-analog converting system clocked by a clock signal having a clock period, said system comprising:
a first digital-to-analog converter connected to receive a first digital data stream and operable to convert said first digital data stream to a first analog signal;
first timing circuitry connected to receive said first analog signal and operable to output said first analog signal for a first half of said clock period;
a second digital-to-analog converter connected to receive a second digital data stream and operable to convert said second digital data stream to a second analog signal;
second timing circuitry connected to receive said second analog signal and operable to output said second analog signal for a second half of said clock period; and
a combiner operable to combine said first analog signal and second analog signal to produce an interleaved analog signal,
wherein said combiner includes respective cables extending from said first timing circuitry and said second timing circuitry.

6. The system of claim 5, wherein said cables have a matched length.

7. The system of claim 6, wherein said combiner includes a matched power splitter.

8. The system of claim 5, wherein lengths of said cables are selected to produce a time delay of one-half of said clock period between said first analog signal and said second analog signal.

9. A digital-to-analog converting system clocked by a clock signal having a clock period, said system comprising:
- a first digital-to-analog converter connected to receive a first digital data stream and operable to convert said first digital data stream to a first analog signal;
- first timing circuitry connected to receive said first analog signal and operable to output said first analog signal for a first half of said clock period;
- a second digital-to-analog converter connected to receive a second digital data stream and operable to convert said second digital data stream to a second analog signal;
- second timing circuitry connected to receive said second analog signal and operable to output said second analog signal for a second half of said clock period;
- a combiner operable to combine said first analog signal and second analog signal to produce an interleaved analog signal;
- wherein said first digital-to-analog converter further includes:
- a first return-to-zero sub-digital-to-analog converter connected to receive said first digital data stream; and
- a second return-to-zero sub-digital-to-analog converter;
- wherein said first return-to-zero sub-digital-to-analog converter and said second return-to-zero sub-digital-to-analog converter are independently controllable to disable said second return-to-zero sub-digital-to-analog converter while said first return-to-zero sub-digital-to-analog converter is receiving and converting said first digital data stream.

10. The system of claim 9, wherein said second digital-to-analog converter further includes:
- a third return-to-zero sub-digital-to-analog converter connected to receive said second digital data stream; and
- a fourth return-to-zero sub-digital-to-analog converter;
- wherein said third return-to-zero sub-digital-to-analog converter and said fourth return-to-zero sub-digital-to-analog converter are independently controllable to disable said fourth return-to-zero sub-digital-to-analog converter while said third return-to-zero sub-digital-to-analog converter is receiving and converting said second digital data stream.

11. A digital-to-analog converting system clocked by a clock signal having a clock period, said system comprising:
- a first digital-to-analog converter connected to receive a first digital data stream and operable to convert said first digital data stream to a first analog signal;
- first timing circuitry connected to receive said first analog signal and operable to output said first analog signal for a first half of said clock period;
- a second digital-to-analog converter connected to receive a second digital data stream and operable to convert said second digital data stream to a second analog signal;
- second timing circuitry connected to receive said second analog signal and operable to output said second analog signal for a second half of said clock period; and
- a combiner operable to combine said first analog signal and second analog signal to produce an interleaved analog signal;
- wherein said first digital-to-analog converter and said second digital-to-analog converter include return-to-zero digital-to-analog converters.

12. A digital-to-analog converting system clocked by a clock signal having a clock period, said system comprising:
- a first digital-to-analog converter connected to receive a first digital data stream and operable to convert said first digital data stream to a first analog signal;
- first timing circuitry connected to receive said first analog signal and operable to output said first analog signal for a first half of said clock period;
- a second digital-to-analog converter connected to receive a second digital data stream and operable to convert said second digital data stream to a second analog signal;
- second timing circuitry connected to receive said second analog signal and operable to output said second analog signal for a second half of said clock period;
- a combiner operable to combine said first analog signal and second analog signal to produce an interleaved analog signal; and
- a reconstruction filter connected to receive said interleaved analog signal and operable to filter said interleaved analog signal with a cutoff frequency at twice a frequency of said first digital data stream and said second digital data stream.

13. A method for producing an interleaved analog signal, said method comprising:
- receiving a first digital data stream, a second digital data stream and a clock signal having a clock period;
- converting said first digital data stream to a first analog signal;
- converting said second digital data stream to a second analog signal;
- outputting said first analog signal for a first half of said clock period; and
- outputting said second analog signal for a second half of said clock period to produce the interleaved analog signal;
- wherein said first and second digital data streams vary as a function of time and said second digital data stream is independent of said first digital data stream.

14. The method of claim 13, wherein said converting said first digital data stream further includes converting said first digital data stream to said first analog signal on a first edge of said clock period and said converting said second digital data stream further includes converting said second digital data stream to said second analog signal at a second edge of said clock period.

15. The method of claim 13, wherein said outputting said first analog signal further includes outputting said first analog signal on said second edge and said outputting said second analog signal further includes outputting said second analog signal on said first edge.

16. A method for producing an interleaved analog signal, said method comprising:
- receiving a first digital data stream, a second digital data stream and a clock signal having a clock period;
- converting said first digital data stream to a first analog signal;
- converting said second digital data stream to a second analog signal;
- outputting said first analog signal for a first half of said clock period; and
- outputting said second analog signal for a second half of said clock period to produce the interleaved analog signal;

wherein said converting said first digital data stream comprises converting even samples of a master digital data stream but not odd samples of said master digital data stream, and wherein said converting said second digital data stream comprises converting odd samples of said master digital data stream but not said even samples of said master digital data stream.

17. A method for producing an interleaved analog signal, said method comprising:

receiving a first digital data stream, a second digital data stream and a clock signal having a clock period;

converting said first digital data stream to a first analog signal;

converting said second digital data stream to a second analog signal;

outputting said first analog signal for a first half of said clock period:

outputting said second analog signal for a second half of said clock period to produce the interleaved analog signal; and selecting respective cable lengths for said first analog signal and said second analog signal to produce a time delay of one-half of said clock period between said first analog signal and said second analog signal.

18. A method for producing an interleaved analog signal, said method comprising:

receiving a first digital data stream, a second digital data stream and a clock signal having a clock period;

converting said first digital data stream to a first analog signal;

converting said second digital data stream to a second analog signal outputting said first analog signal for a first half of said clock period; and outputting said second analog signal for a second half of said clock period to produce the interleaved analog signal;

wherein said converting said first digital data stream further includes:

providing a first digital-to-analog converter including a first return-to-zero sub-digital-to-analog converter connected to receive said first digital data stream and a second return-to-zero sub-digital-to-analog converter; and disabling said second return-to-zero sub-digital-to-analog converter while said first return-to-zero sub-digital-to-analog converter is receiving and converting said first digital data stream.

19. The method of claim 18, wherein said converting said second digital data stream further includes;

providing a second digital-to-analog converter including a third return-to-zero sub-digital-to-analog converter connected to receive said second digital data stream and a fourth return-to-zero sub-digital-to-analog converter; and disabling said fourth return-to-zero sub-digital-to-analog converter while said third return-to-zero sub-digital-to-analog converter is receiving and converting said second digital data stream.

20. A method for producing an interleaved analog signal, said method comprising:

receiving a first digital data stream, a second digital data stream and a clock signal having a clock period;

converting said first digital data stream to a first analog signal converting said second digital data stream to a second analog signal outputting said first analog signal for a first half of said clock period; and outputting said second analog signal for a second half of said clock period to produce the interleaved analog signal; and filtering said interleaved analog signal with a cutoff frequency at twice a frequency of said first digital data stream and said second digital data stream.

* * * * *